(12) United States Patent
Duan et al.

(10) Patent No.: US 10,644,226 B2
(45) Date of Patent: *May 5, 2020

(54) METHOD AND SYSTEM FOR ENGINEERING THE SECONDARY BARRIER LAYER IN DUAL MAGNETIC JUNCTIONS

(71) Applicant: Samsung Electronics Co., Ltd., Gyeonggi-do (KR)

(72) Inventors: Zheng Duan, San Jose, CA (US); Dmytro Apalkov, San Jose, CA (US); Vladimir Nikitin, Campbell, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/453,854

(22) Filed: Jun. 26, 2019

(65) Prior Publication Data

US 2019/0319182 A1    Oct. 17, 2019

Related U.S. Application Data

(63) Continuation of application No. 15/968,471, filed on May 1, 2018, now Pat. No. 10,381,550.

(60) Provisional application No. 62/636,891, filed on Mar. 1, 2018.

(51) Int. Cl.
| | |
|---|---|
| *H01L 43/08* | (2006.01) |
| *H01L 43/02* | (2006.01) |
| *H01L 43/12* | (2006.01) |
| *H01L 27/22* | (2006.01) |
| *H01L 43/10* | (2006.01) |

(52) U.S. Cl.
CPC ............ *H01L 43/02* (2013.01); *H01L 27/226* (2013.01); *H01L 43/08* (2013.01); *H01L 43/10* (2013.01); *H01L 43/12* (2013.01)

(58) Field of Classification Search
CPC ....... H01L 43/02; H01L 27/226; H01L 43/12; H01L 43/08; H01L 43/10; G11C 11/161; G11C 11/1673; G11C 11/1675
See application file for complete search history.

(56) References Cited

U.S. PATENT DOCUMENTS

| | | | |
|---|---|---|---|
| 7,486,486 B2 | 2/2009 | Nakamura | |
| 7,791,843 B2 | 9/2010 | Kamiguchi | |
| 8,546,896 B2 | 10/2013 | Lottis | |
| 9,490,422 B1 | 11/2016 | Hu | |

(Continued)

*Primary Examiner* — Ahmed N Sefer
(74) *Attorney, Agent, or Firm* — Van Pelt, Yi & James LLP

(57) ABSTRACT

A magnetic junction, a memory using the magnetic junction and method for providing the magnetic junction are described. The magnetic junction includes first and second reference layers, a main barrier layer, a free layer, an engineered secondary barrier layer and a second reference layer. The free layer is switchable between stable magnetic states when a write current is passed through the magnetic junction. The main barrier layer is between the first reference layer and the free layer. The secondary barrier layer is between the free layer and the second reference layer. The engineered secondary barrier layer has a resistance and a plurality of regions having a reduced resistance less than the resistance. The free and reference layers each has a perpendicular magnetic anisotropy energy and an out-of-plane demagnetization energy less than the perpendicular magnetic anisotropy energy.

18 Claims, 5 Drawing Sheets

(56) References Cited

U.S. PATENT DOCUMENTS

| | | | |
|---|---|---|---|
| 9,876,164 B1 * | 1/2018 | Tang | G11C 11/161 |
| 2006/0152858 A1 * | 7/2006 | Lille | B82Y 25/00 |
| | | | 360/324.2 |
| 2006/0227465 A1 | 10/2006 | Inokuchi | |
| 2012/0261776 A1 * | 10/2012 | Tang | H01L 43/08 |
| | | | 257/421 |
| 2012/0267736 A1 * | 10/2012 | Moon | H01L 43/08 |
| | | | 257/421 |
| 2013/0154035 A1 | 6/2013 | Krounbi | |
| 2013/0234266 A1 | 9/2013 | Prejbeanu | |
| 2014/0050019 A1 | 2/2014 | Lee | |
| 2015/0294703 A1 | 10/2015 | Apalkov | |
| 2016/0005956 A1 | 1/2016 | Tang | |
| 2016/0197264 A1 | 7/2016 | Khvalkovskiy | |
| 2018/0190898 A1 | 7/2018 | Wang | |
| 2018/0261762 A1 | 9/2018 | Apalkov | |

* cited by examiner

METHOD AND SYSTEM FOR ENGINEERING THE SECONDARY BARRIER LAYER IN DUAL MAGNETIC JUNCTIONS

CROSS-REFERENCE TO RELATED APPLICATIONS

This application is a continuation of U.S. patent application Ser. No. 15/968,471, entitled METHOD AND SYSTEM FOR ENGINEERING THE SECONDARY BARRIER LAYER IN DUAL MAGNETIC JUNCTIONS, filed May 1, 2018, which claims priority U.S. Provisional Patent Application No. 62/636,891, entitled TMR AND SWITCHING EFFICIENCY IN DUAL MTJS BY PINHOLES IN THE THINNER BARRIER, filed Mar. 1, 2018, both of which are incorporated herein by reference for all purposes.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional dual magnetic tunneling junction (DMTJ) may be used in a conventional STT-MRAM. The conventional DMTJ typically resides on a substrate. The DMTJ uses seed layer(s), may include capping layers and may include antiferromagnetic (AFM) layers to fix the magnetization of the reference layers. The conventional DMTJ includes a first reference layer, a first (main) tunneling barrier layer, a free layer, a second (secondary) tunneling barrier layer and a second free layer. The main tunneling barrier layer is between the first reference layer and free layer. The secondary tunneling barrier layer is between the second reference layer and the free layer. The secondary tunneling barrier layer is typically thinner than the main tunneling barrier layer. A bottom contact below the DMTJ and a top contact on the DMTJ may be used to drive current through the MTJ in a current-perpendicular-to-plane (CPP) direction. The reference layers and the free layer are magnetic. The magnetization of the reference layer is fixed, or pinned, in a particular direction. The free layer has a changeable magnetization. The free layer and reference layer may be a single layer or include multiple layers.

To switch the magnetization of the free layer, a current is driven in the CPP direction. When a sufficient current is driven between the top and bottom contacts in one direction, the magnetization of the free layer may switch to be parallel to the magnetization of a first reference layer. When a sufficient current is driven in the opposite direction, the magnetization of the free layer may switch to be antiparallel to that of the first reference layer. The differences in magnetic configurations correspond to different magnetoresistances and thus different logical states (e.g. a logical "0" and a logical "1") of the conventional MTJ. To reduce the switching current, the magnetizations of the reference layers are in a dual state. In other words, the magnetic moments of the reference layers are antiparallel. However, the dual state results in a reduced tunneling magnetoresistance.

Because of their potential for use in a variety of applications, research in magnetic memories is ongoing. For example, a low switching current and a high signal are desired. Accordingly, what is needed is a method and system that may improve the performance of spin transfer torque based memories and the electronic devices in which such memories are used. The method and system described herein address such a need.

BRIEF SUMMARY OF THE INVENTION

A magnetic junction, a memory using the magnetic junction and method for providing the magnetic junction are described. The magnetic junction includes a first reference layer, a main barrier layer having a first thickness, a free layer, an engineered secondary barrier layer and a second reference layer. The free layer is switchable between stable magnetic states when a write current is passed through the magnetic junction. The main barrier layer is between the first reference layer and the free layer. The engineered secondary barrier layer is between the free layer and the second reference layer. The engineered secondary barrier layer has a resistance, a second thickness less than the first thickness, and a plurality of regions having a reduced resistance less than the resistance. The free layer, the first reference layer and the second reference layer each has a perpendicular magnetic anisotropy energy and an out-of-plane demagnetization energy. The out-of-plane demagnetization energy is less than the perpendicular magnetic anisotropy energy.

The magnetic junction may have improved write and/or read characteristics. As a result, performance may be improved.

DETAILED DESCRIPTION OF THE INVENTION

Figure 1A:
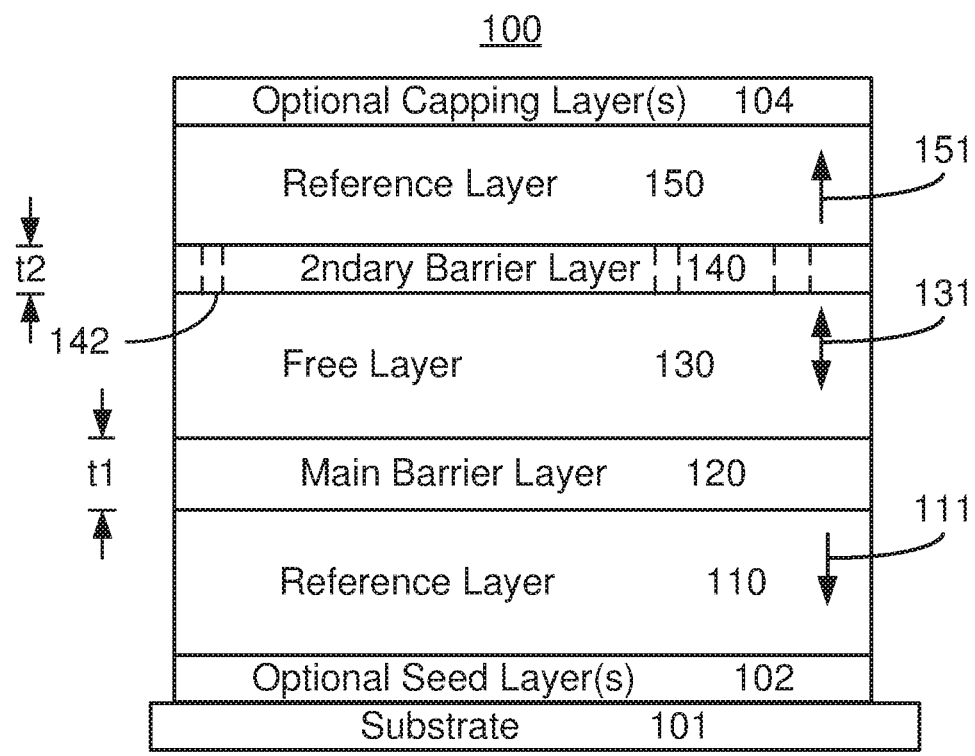
FIGS. 1A-1B depict exemplary embodiments of a dual magnetic junction usable in a magnetic memory, programmable using spin transfer torque and including an engineered secondary barrier layer.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and nonportable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction, a memory using the magnetic junction and method for providing the magnetic junction are described. The magnetic junction includes a first reference layer, a main barrier layer having a first thickness, a free layer, an engineered secondary barrier layer and a second reference layer. The free layer is switchable between stable magnetic states when a write current is passed through the magnetic junction. The main barrier layer is between the first reference layer and the free layer. The engineered secondary barrier layer is between the free layer and the second reference layer. The engineered secondary barrier layer has a resistance, a second thickness less than the first thickness, and a plurality of regions having a reduced resistance less than the resistance. For example, the engineered secondary barrier layer may have one or more of regions of reduced (and/or zero) thickness, more highly conductive doped regions, and more highly conductive intermixed regions. The free layer, the first reference layer and the second reference layer each has a perpendicular magnetic anisotropy energy and an out-of-plane demagnetization energy. The out-of-plane demagnetization energy is less than the perpendicular magnetic anisotropy energy.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. One of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. One of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used.

Figure 1B:
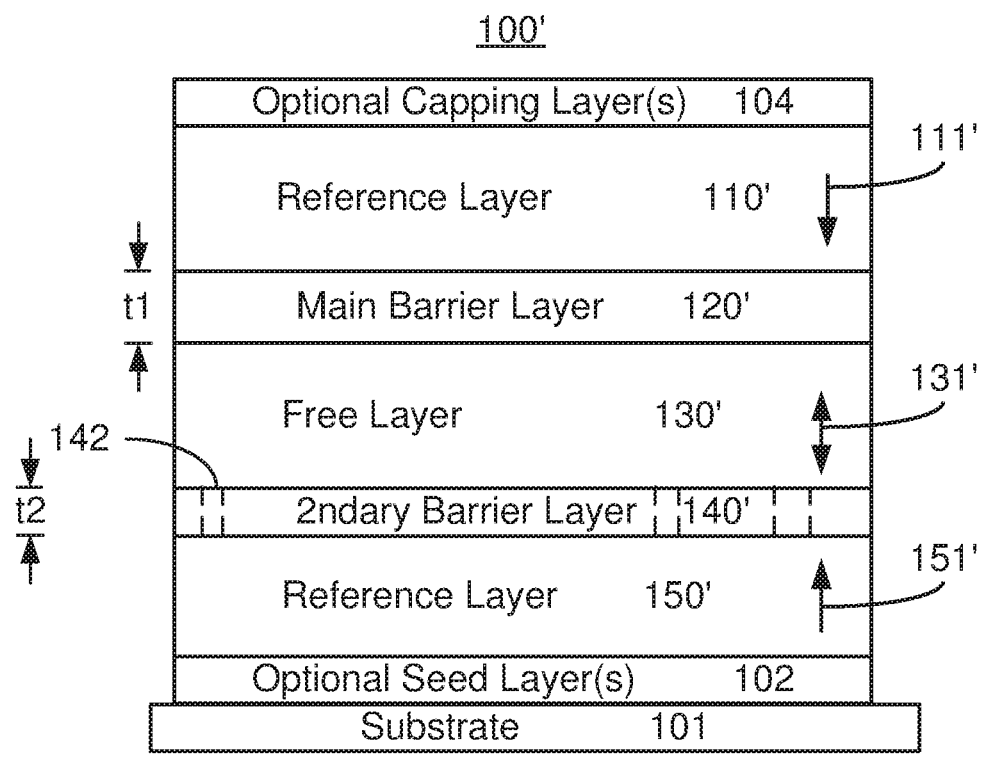

FIGS. 1A and 1B depict exemplary embodiments of a dual magnetic junction 100 and a dual magnetic junction 100', respectively usable in a magnetic memory, programmable using spin transfer torque. For clarity, FIGS. 1A-1B are not to scale and not all components may be shown. The magnetic junctions 100 and/or 100' may be used in a magnetic device such as a spin transfer torque magnetic random-access memory (STT-MRAM) and, therefore, in a variety of electronic devices.

Referring to FIG. 1A the magnetic junction 100 may include a first reference (or pinned) layer 110 having a magnetic moment 111, a main barrier layer 120, a free layer 130, an engineered secondary barrier layer 140 and a second reference (or pinned) layer 150 having magnetic moment 151. Also shown are optional seed layer(s) 102 and capping layer(s) 104. The substrate 101 on which the magnetic junction 100 is formed resides below the seed layers and is shown for clarity. A bottom contact and a top contact are not shown but may be formed. Other layers such as coupling layers and antiferromagnetic (AFM) or other layers and/or other layers may be present. Polarization enhancement layer(s) (PEL(s)) may also be included. For example, PEL(s) may reside between the reference layer(s) 110 and/or 150 and the barrier layers 120 and 140, respectively. However, such layers are not shown for simplicity. As can be seen in FIG. 1A, the dual magnetic junction 100 has its reference layer 110 and main barrier layer 120 closest to the substrate 101. In other embodiments, the order of the layers 110, 120, 130, 140 and 150 may differ.

The free layer 130 may have a high perpendicular magnetic anisotropy (PMA). Thus, the free layer 130 has a PMA energy greater than a free layer out-of-plane demagnetization energy. Thus, the moment 131 is stable perpendicular-to-plane. As can be inferred from the double-headed arrow, the free layer magnetic moment 131 may be stable when pointed toward the top of the page and when pointed toward the bottom of the page in FIG. 1A. In alternate embodiments, the magnetic moment 131 may be stable in-plane. The free layer 130 is depicted as a single layer. However, in other embodiments, the free layer 130 may be a multilayer. The free layer 130 might be a synthetic antiferromagnet including multiple ferromagnetic layers interleaved with and sandwiching one or more nonmagnetic layers. For example, the free layer 130 might include two ferromagnetic layers separated by a nonmagnetic layer, such as a Ru layer. The thickness of the Ru layer may be selected so that the ferromagnetic layers are antiferromagnetically coupled via a Ruderman-Kittel-Kasuya-Yosida (RKKY) coupling. Alternatively, the nonmagnetic layer thickness may be selected for ferromagnetic coupling. In other embodiments, the free layer 130 might be some other multilayer and/or may have layer(s) coupled in another manner. In some embodiments, the free layer may include or consist of an Fe layer, a $(CoFe)_{1-y}B_y$ layer and/or a $(CoFeNi)_{1-y}B_y$ layer where $0 \leq y < 1$. In other embodiments, the free layer might consist of a $(CoFe)_{1-y}B_y$ layer and an Fe layer where $0 \leq y < 1$. Other or additional alloys and/or multilayers may be used in other embodiments.

The free layer 130 has a changeable magnetic moment 131 and, therefore, may be used to store data. The magnetic junction 100 is also configured to allow the free layer magnetic moment 131 to be switched between stable magnetic states when a write current is passed through the magnetic junction 100. Thus, the free layer 130 is switchable utilizing spin transfer torque when a write current is driven through the magnetic junction 100 in a current perpendicular-to-plane (CPP) direction. Depending upon the direction of the write current, towards the top or bottom of the page in FIG. 1A, the free layer 130 may be programmed to different states. The direction of the magnetic moment 131 of the free layer 130 may be read by driving a read current through the magnetic junction 100. Such a read current is less than the write current and insufficient to switch the direction of the magnetic moment.

The main barrier layer 120 may be a tunneling barrier layer. For example, the main barrier layer 120 may be a crystalline MgO tunneling barrier with a (100) orientation. Such a main barrier layer 120 may not only enhance the tunneling magnetoresistance (TMR) of the magnetic junction 100, but also increase the PMA of the free layer 130. A crystalline MgO tunneling barrier layer 120 may have a thickness of at least eight Angstroms and not more than fifteen Angstroms. For example, a crystalline MgO tunneling barrier layer 120 may be nominally at least nine and not more than thirteen Angstroms thick. However, other thicknesses may be possible and/or other materials are possible. For example, the main barrier layer 120 may include or consist of one or more of MgO, magnesium aluminum oxide (MgAlOx, where Ox indicates varying stoichiometry of the oxide), magnesium titanium oxide (MgTiOx, where Ox indicates varying stoichiometry of the oxide), magnesium iron oxide (MgFeOx, where Ox indicates varying stoichiometry of the oxide) and/or other oxides or materials. In some embodiments, the oxides selected for the main barrier layer 120 allow the main barrier layer 120 to function as a spin filter. The main barrier layer 120 may also be considered to serve as a seed layer for the free layer 130. In an alternate embodiment, the main barrier layer 120 may have another structure including but not limited to being a conductive layer.

The reference layers 110 and 150 may each have a PMA energy greater than the out-of-plane demagnetization energy. Thus, the magnetic moments 111 and 151 are stable perpendicular-to-plane. The reference layers 110 and 150 are each shown as being a single layer. However, in other embodiments, one or both of the reference layers 110 and 150 may be a multilayer. For example, the reference layer(s) 110 and/or 150 might be a SAF as described above. In other embodiments, other multilayers may be used. The reference layer 110 and/or 150 may include a Co—Pt layer and/or a Co—Ir layer. For example, the reference layer 110 and/or 150 may be or include a Co/Pt multilayer. In such a multilayer, one or more repeats of a Co/Pt bilayer ([Co/Pt]n, with n≥1) may be used. In some embodiments, the reference layer 110 and/or 150 may be or include a Co/Ir multilayer. Such a multilayer has one or more repeats of a Co/Ir bilayer ([Co/Ir]n, with n≥1). Other reference layer(s) having other structures and/or using other materials might be used in some embodiments. Optional pinning layer(s) (not shown) may be used to fix the magnetization of the reference layer 110 and/or 150. In some embodiments, the optional pinning layer may be an AFM layer or multilayer that pins the magnetization(s) through an exchange-bias interaction. However, in other embodiments, the optional pinning layer may be omitted or another structure may be used. In the embodiment shown, the magnetic moments 111 and 151 of the reference layers 110 and 150, respectively, are pinned by the magnetic anisotropy of the reference layer 110.

As can be seen in FIG. 1A, the reference layers 110 and 150 are in a dual state. Stated differently, the magnetic moments 111 and 151 are aligned antiparallel. Such a configuration allows for spin transfer torque from both layers 110 and 150 to contribute to switching of the free layer 130. Thus, a reduction in switching current and/or time may be achieved.

Also shown in FIG. 1A is the engineered secondary barrier layer 140. The engineered secondary barrier 140 is generally nonmagnetic. The engineered secondary barrier layer 140 may be a tunneling barrier layer. For example, the engineered secondary barrier layer 140 may include or consist of crystalline MgO tunneling with a (100) orientation. Such a secondary barrier layer 140 increase the PMA of the free layer 130 and/or reference layer 150. The engineered secondary barrier layer 140 may include or consist of one or more of MgO, MgAlOx, MgTiOx, MgFeOx and/or other oxides or materials. In some embodiments, the oxides selected for the engineered secondary barrier 140 allow the engineered secondary barrier layer 140 to function as a spin filter. The engineered secondary barrier layer 140 may also be considered to serve as a capping layer for the free layer 130 or a seed layer for the reference layer 150.

The engineered secondary barrier layer 140 has a resistance and a second thickness, t2. The main barrier layer has a first thickness, t1. The thickness of the secondary barrier layer 140 is less than the thickness of the main barrier layer 120 (t2<t1). In some embodiments, the secondary barrier layer 140 has a thickness of at least five Angstroms and not more than eight Angstroms. However, other thicknesses are possible. In addition, the engineered secondary barrier layer 140 has regions 140 shown by a dashed line in FIG. 1A. For clarity, only one of the regions 142 is labeled. Each of the regions 142 has a reduced resistance. Thus, the resistance of each region 142 is less than the resistance of the secondary barrier layer 140. This resistance of the secondary barrier layer 140 may be one or more of the resistance of remaining portions of the secondary barrier layer 140 outside of the regions 142, the average/mean resistance of the secondary barrier layer 140 or the maximum resistance of the secondary barrier layer 140.

The reduction in resistance of the regions 142 may be achieved in one or more of a number of ways. In some embodiments, the regions 142 may have a reduced thickness. For example, the secondary barrier layer 140 may be thinned and/or include apertures (pinholes) in the regions 142. In some embodiments, the engineered secondary barrier layer 140 may be doped with more conductive (e.g. metallic) dopants. For example, the engineered secondary barrier layer 140 may include not more than five atomic percent of one or more metallic dopants. The dopant(s) might include at least one of Fe, Ni, Cr, Ti and Mg. The regions 142 may be dopant rich. The remaining portions of the engineered secondary barrier layer 140 may essentially be the oxide(s) described above. In some embodiments, the engineered secondary barrier layer 140 may include an insulator, such as one or more of the oxides above, intermixed with at least one conductor. The conductor may be metallic. For example, the conductor may include one or more of Fe, Ni, Cr, Ti and Mg. The regions 142 may be rich in the conductor(s). Two or more of these mechanisms for the reduced resistance regions 142 may be combined and/or other configurations may be used.

Because of the presence of the regions 142 having a reduced resistance, the engineered secondary barrier layer 140 has a resistance area product (RA) that is less than what the RA would be in absence of the regions 142. For example, if the regions 142 are thinner regions or pinholes, these regions have a higher conductivity/lower resistivity than the surrounding insulator. Consequently, the RA of such a secondary barrier layer 140 would be less than the RA of a barrier layer having the same, constant thickness (with no thinned regions/pinholes) and that is formed using the same insulator. For example, in some embodiments, the RA may be approximately at least 0.1 and not more than one for the secondary barrier layer 140. However, other values of RA are possible.

The engineered secondary barrier layer 140 may improve the tunneling magnetoresistance (TMR) of the magnetic junction 100 because of the reduced RA. The tunneling magnetoresistance is the change in resistance between the states divided by the resistance (ΔR/R). The reference layers 110 and 150 are in a dual state. Consequently, a current driven in the CPP direction will have a high resistance across the main barrier layer 120 (e.g. free layer magnetic moment 131 and reference layer magnetic moment 110 parallel) and a low resistance across the secondary barrier layer (e.g. free layer magnetic moment 131 and reference layer magnetic moment 110 parallel) and vice versa. If the RAs of the barrier layers 120 and 140 are the same, the magnetoresistance for current driven in one direction perpendicular-to-plane is the same as for current driven in the opposite direction. Consequently, the TMR is reduced to at or near zero. Because the secondary barrier layer 140 is thinner than the main barrier layer 120, the contribution to the TMR of the secondary barrier layer 140 is reduced. Stated differently, the opposing TMR across the secondary barrier layer 140 is reduced because the resistance across the secondary barrier layer is reduced. Thus, the difference in resistance for current driven in opposite directions is larger. The regions 142 further reduce the resistance of the secondary barrier layer 140 and, therefore, the contribution of the secondary barrier layer 140 to the TMR. Thus, the difference in resistances between the current driven through the magnetic junction 100 in opposite directions is increased. Thus, TMR is enhanced. In some embodiments, the TMR is increased by at least thirty percent. In some embodiments the TMR is increased by at least fifty percent. In some embodiments, the TMR for the magnetic junction may be at least sixty percent and not more than one hundred fifty percent. However, other values of TMR are possible and (particularly higher values) desirable.

The magnetic junction 100 having the engineered secondary barrier layer 140 may have improved read and/or write performance. Because the reference layers 110 and 150 are in a dual state (magnetic moments 111 and 151 in opposite directions), the free layer 130 can be written using spin transfer torque at lower currents. Further, the materials selected for the main barrier layer 120 and engineered secondary barrier layer 140 may provide a spin filtering, preserving spin torque through the layers 120 and 140. The resistance and RA of the engineered secondary barrier layer 140 may be reduced by the presence of the regions 142. Further, the regions 142 and secondary barrier layer 140 may preserve spin torque across the barrier layer. Thus, the RA of the magnetic junction 100 may be reduced substantially without adversely affecting the writing using spin transfer torque. Thus, the magnetic junction 100 may have improved writing performance. The lower RA of the secondary barrier layer 140 may improve the TMR of the magnetic junction 100. Thus, the read characteristics of the magnetic junction 100 may be improved substantially without adversely affecting the write characteristics.

FIG. 1B depicts a magnetic junction 100'. For clarity, FIG. 1B is not to scale and not all components may be shown. The magnetic junction 100' is analogous to the magnetic junction 100A. Consequently, similar components have analogous labels. The magnetic junction 100' includes reference layer 110', main barrier layer 120', free layer 130', engineered secondary barrier layer 140' and reference layer reference layer 150', that are analogous to reference layer 110, main barrier layer 120, free layer 130, engineered secondary barrier layer 140 and reference layer reference layer 150, respectively. Optional seed layer 102 and capping layer 104 as well as the substrate 101 are also shown.

The structure, function and material(s) used for the layers 110', 120', 130', 140' and 150' in the magnetic junction 100' are analogous to those of the layers 110, 120, 130, 140 and 150, respectively, in the magnetic junction 100. For example, the engineered secondary barrier layer 140' has regions 142 of lower resistance, has a lower resistance than the main barrier 150' and is thinner than the main barrier 150'. However, the relationship to the substrate for the layers 110', 120', 130', 140' and 150' has been reversed. Thus, the magnetic junction 100' is still a dual magnetic junction, but has the secondary barrier layer 140' closer to the substrate 101 than the main barrier 120'.

The magnetic junction 100' shares the benefits of the magnetic junction 100. The magnetic junction 100' may have improved read and/or write performance. Because the reference layers 110' and 150' are in a dual state (magnetic moments 111' and 151' in opposite directions), the magnetic moment 131' of the free layer 130' can be written using spin transfer torque at lower currents. The resistance and RA of the engineered secondary barrier layer 140 may be reduced by the presence of the regions 142. This may improve TMR and, therefore, reading performance. Further, the regions 142 and secondary barrier layer 140 may preserve spin torque across the barrier layer. Thus, the RA of the magnetic junction 100 may be reduced substantially without adversely affecting the writing using spin transfer torque. Thus, the magnetic junction 100 may have improved writing performance.

Figure 2:
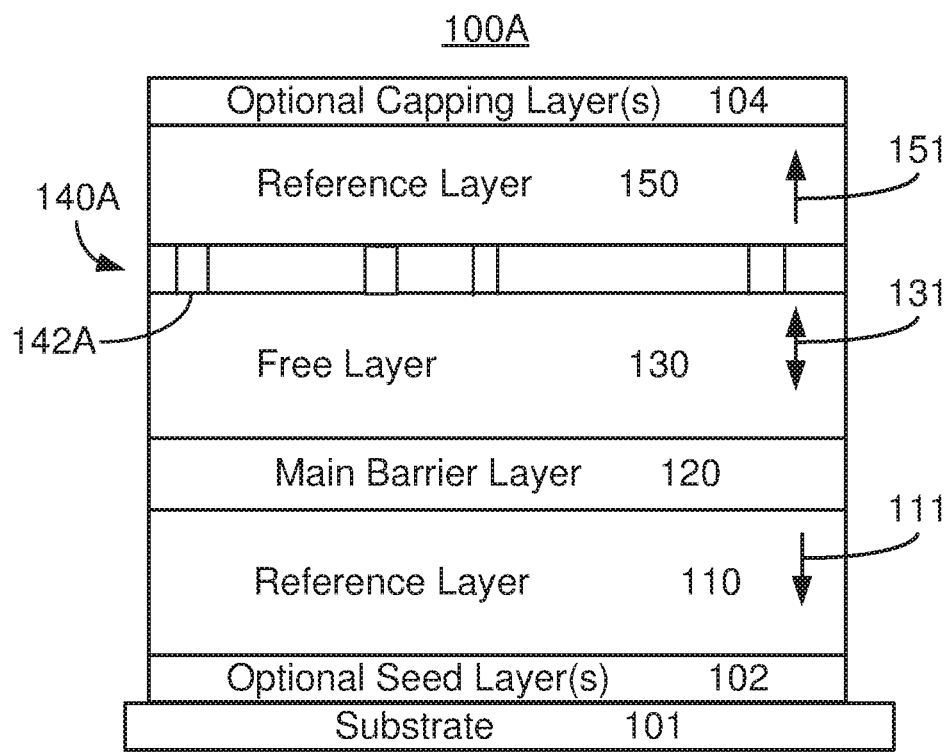
FIG. 2 depicts an exemplary embodiment of another magnetic junction usable in a magnetic memory, programmable using spin transfer torque and including an engineered secondary barrier layer.

FIG. 2 depicts another exemplary embodiment of a dual magnetic junction 100A in magnetic devices such as a magnetic memory programmable using spin transfer torque. For clarity, FIG. 2 is not to scale and not all components may be shown. The magnetic junction 100A is analogous to the magnetic junctions 100 and/or 100'. Consequently, similar components have analogous labels.

The magnetic junction 100A is a dual magnetic junction that includes reference layer 110, main barrier layer 120, free 130, engineered barrier layer 140A and reference layer 150 that are analogous to the reference layer 110, main barrier layer 120, free layer 130, engineered secondary barrier layer 140/140' and reference layer 150, respectively, in FIGS. 1A-1B. Optional seed layer 102 and capping layer 104 as well as the substrate 101 are also shown. In the embodiment shown, the main barrier layer 120 is closer to the substrate 101 than the engineered secondary barrier layer 140A. In another embodiment, the order of the layers 110, 120, 130, 140A and 150 with respect to the substrate may be reversed (or the layers 120 and 140A switched). The structure, function and material(s) used for the reference layer 110, main barrier layer 120, free layer 130, engineered secondary barrier layer 140A and reference layer 150 in the magnetic junction 100A are analogous to those used for the reference layer 110, main barrier layer 120, free layer 130, engineered secondary barrier layer 140/140' and reference layer 150, respectively, in the magnetic junctions 100 and/or 100'.

The engineered secondary barrier layer 140A includes regions 142A. In the embodiment shown in FIG. 2, the regions 142A are apertures, or pinholes, in the secondary barrier layer 140A. As a result, the thickness of the secondary barrier layer 140A may be considered to vary. Because of the presence of the pinholes 142A, the RA and resistance of the secondary barrier layer 140A may be reduced. However, the spin filter effect of the secondary barrier layer 140A may be substantially preserved despite the existence of pinholes 142A.

The magnetic junction 100A may share the benefits of the magnetic junctions 100 and/or 100'. In particular, the magnetic junction 100A may have improved read and/or write performance. Because the reference layers 110 and 150 are in a dual state, lower write currents may be used. The resistance and RA of the engineered secondary barrier layer 140 may be reduced by the presence of the pinholes 142A. This may improve TMR and, therefore, reading performance. Further, the pinholes 142A and secondary barrier layer 140A may preserve spin torque across the barrier layer. Thus, the RA of the magnetic junction 100A may be reduced substantially without adversely affecting the writing using spin transfer torque. Thus, the magnetic junction 100A may also have improved writing performance.

Figure 3:
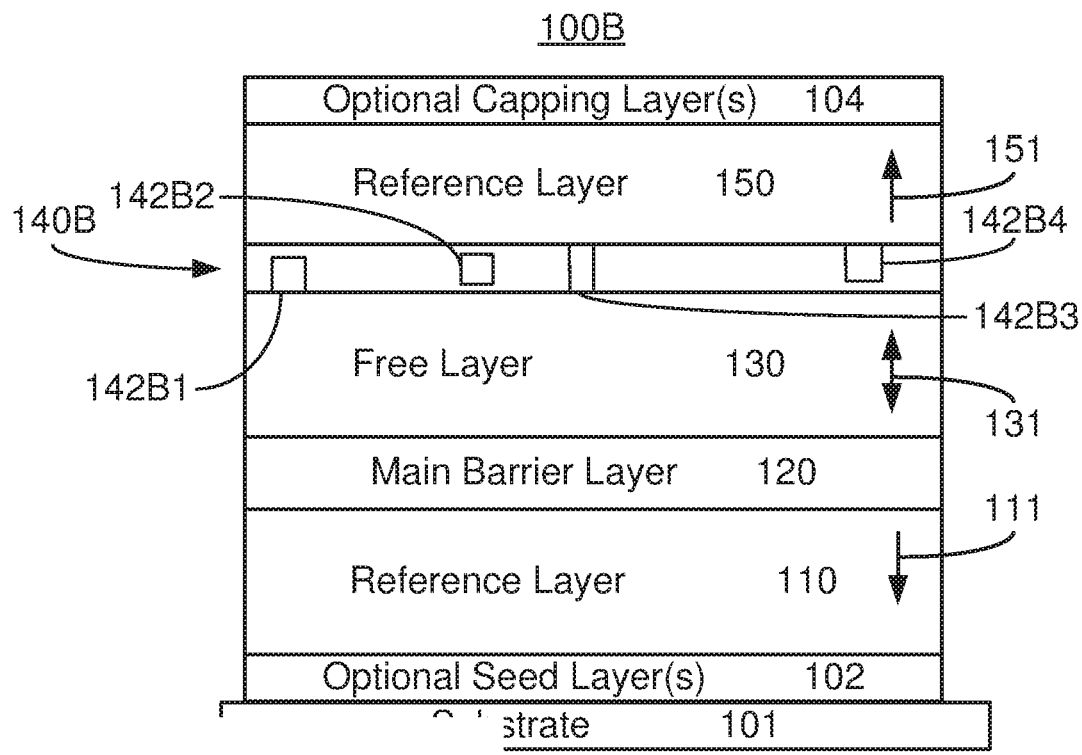
FIG. 3 depicts exemplary embodiments of another magnetic junction usable in a magnetic memory, programmable using spin transfer torque and including an engineered secondary barrier layer.

FIG. 3 depicts another exemplary embodiment of a dual magnetic junction 100B in magnetic devices such as a magnetic memory programmable using spin transfer torque. For clarity, FIG. 3 is not to scale and not all components may be shown. The magnetic junction 100B is analogous to the magnetic junctions 100, 100' and/or 100A. Consequently, similar components have analogous labels.

The magnetic junction 100B is a dual magnetic junction that includes reference layer 110, main barrier layer 120, free 130, engineered barrier layer 140B and reference layer 150 that are analogous to the reference layer 110, main barrier layer 120, free layer 130, engineered secondary barrier layer 140/140'/140A and reference layer 150, respectively. Optional seed layer 102 and capping layer 104 as well as the substrate 101 are also shown. In the embodiment shown, the main barrier layer 120 is closer to the substrate 101 than the engineered secondary barrier layer 140B. In another embodiment, the order of the layers 110, 120, 130, 140B and 150 with respect to the substrate may be reversed (or the layers 120 and 140B switched). The structure, function and material(s) used for the reference layer 110, main barrier layer 120, free layer 130, engineered secondary barrier layer 140B and reference layer 150 in the magnetic junction 100B are analogous to those used for the reference layer 110, main barrier layer 120, free layer 130, engineered secondary barrier layer 140/140'/140A and reference layer 150, respectively, in the magnetic junctions 100, 100' and/or 100A.

The engineered secondary barrier layer 140B includes regions 142B1, 142B2, 142B3 and 142B4 (collectively 142B). In the embodiment shown in FIG. 3, the regions 142B are regions of varying (reduced) thickness of the secondary barrier layer 140B. Region 142B3 is a pinhole through the engineered secondary barrier layer 140B. Thus, the thickness of the secondary barrier layer 140B is zero is at the pinhole 142B3. Regions 142B1 and 142B4 are where the secondary barrier layer 140B is thinned at the bottom and top, respectively. Region 142B2 is a void in the secondary barrier layer 140B. Because of the presence of the regions 142B, the RA and resistance of the secondary barrier layer 140B may be reduced. However, the spin filter effect of the secondary barrier layer 140B may be substantially preserved despite the existence of thinned regions 142B.

The magnetic junction 100B may share the benefits of the magnetic junctions 100, 100' and/or 100A. The magnetic junction 100B may have improved read and/or write performance. Because the reference layers 110 and 150 are in a dual state, lower write currents may be used. The resistance and RA of the engineered secondary barrier layer 140 may be reduced by the presence of the regions 142B. This may improve TMR and, therefore, reading performance. Further, the regions 142B and secondary barrier layer 140B may preserve spin torque across the barrier layer. Thus, the RA of the magnetic junction 100B may be reduced substantially without adversely affecting the writing using spin transfer torque. Thus, the magnetic junction 100B may also have improved writing performance.

Figure 4:
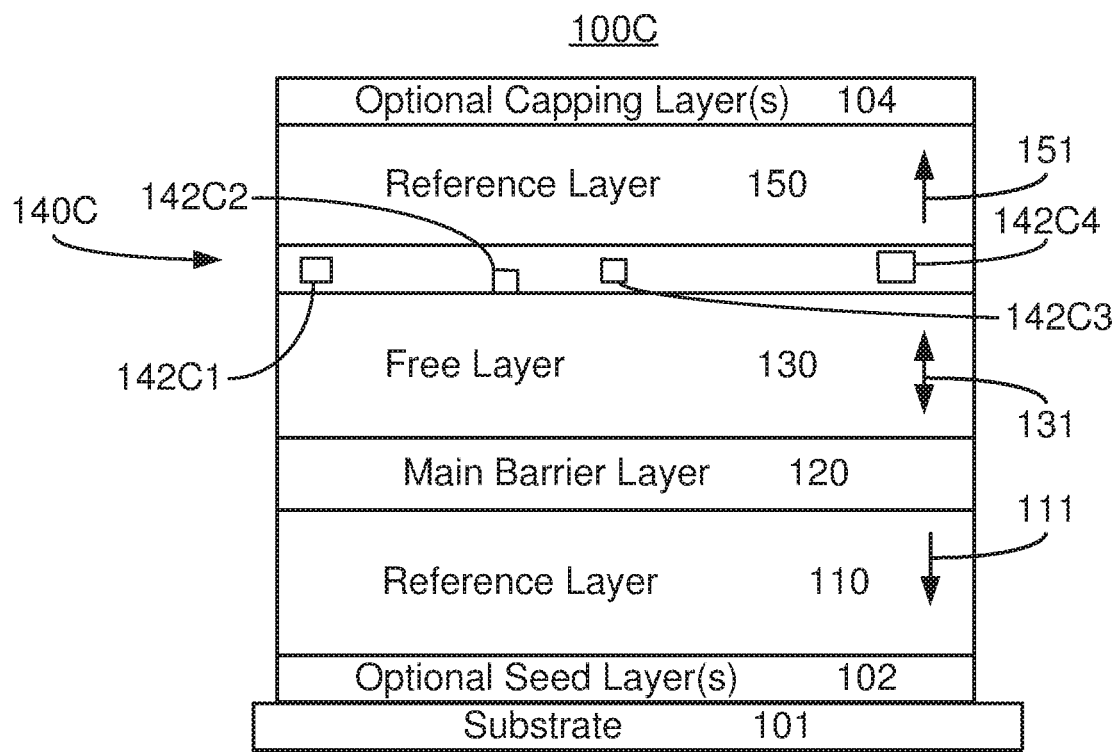
FIG. 4 depicts exemplary embodiments of another magnetic junction usable in a magnetic memory, programmable using spin transfer torque and including an engineered secondary barrier layer.

FIG. 4 depicts another exemplary embodiment of a dual magnetic junction 100B in magnetic devices such as a magnetic memory programmable using spin transfer torque. For clarity, FIG. 4 is not to scale and not all components may be shown. The magnetic junction 100C is analogous to the magnetic junctions 100, 100', 100A and/or 100B. Consequently, similar components have analogous labels.

The magnetic junction 100C is a dual magnetic junction that includes reference layer 110, main barrier layer 120, free 130, engineered barrier layer 140C and reference layer 150 that are analogous to the reference layer 110, main barrier layer 120, free layer 130, engineered secondary barrier layer 140/140'/140A/140B and reference layer 150, respectively. Optional seed layer 102 and capping layer 104 as well as the substrate 101 are also shown. In the embodiment shown, the main barrier layer 120 is closer to the substrate 101 than the engineered secondary barrier layer 140C. In another embodiment, the order of the layers 110, 120, 130, 140C and 150 with respect to the substrate may be reversed (or the layers 120 and 140C switched). The structure, function and material(s) used for the reference layer 110, main barrier layer 120, free layer 130, engineered secondary barrier layer 140C and reference layer 150 in the magnetic junction 100C are analogous to those used for the reference layer 110, main barrier layer 120, free layer 130, engineered secondary barrier layer 140/140'/140A/140B and reference layer 150, respectively.

The engineered secondary barrier layer 140C includes regions 142C1, 142C2, 142C3 and 142C4 (collectively 142C). the regions 142C are regions of varying composition in the secondary barrier layer 140C. In the regions 142C, the engineered secondary barrier layer 142C may be rich in a metal and/or other conductive material. For example, the engineered secondary barrier layer 140C may be an insulator such as those described above, doped by a metal or other appropriate conductor. In some embodiments, the engineered secondary barrier layer 140C includes not more than five atomic percent of dopant(s) including but not limited to at least one of Fe, Ni, Cr, Ti and Mg. In such an embodiment, the regions 142C may be dopant rich. In another embodiment, the engineered secondary barrier layer may be a mixture of an insulator and a metal or other appropriate conductor. For example, the insulator may include one or more of those described above (e.g. MgO, MgAlOx, MgFeOx, MgTiOx) intermixed with a metal such as Fe, Ni, Cr and/or Mg. The oxide and metal may be partially or substantially completely immiscible. Thus, the regions 142C are metal rich regions of the mixture. Because of the presence of the regions 142C, the RA and resistance of the secondary barrier layer 140C may be reduced. However, the spin filter effect of the secondary barrier layer 140C may be substantially maintained.

The magnetic junction 100C may share the benefits of the magnetic junctions 100, 100', 100A and/or 100B. The magnetic junction 100C may have improved read and/or write performance. Because the reference layers 110 and 150 are in a dual state, lower write currents may be used. The resistance and RA of the engineered secondary barrier layer 140C may be reduced by the presence of the regions 142B. This may improve TMR and, therefore, reading performance. Further, the regions 142B and secondary barrier layer 140B may preserve spin torque across the barrier layer. Thus, the RA of the magnetic junction 100B may be reduced substantially without adversely affecting the writing using spin transfer torque. Thus, the magnetic junction 100B may also have improved writing performance.

Figure 5:
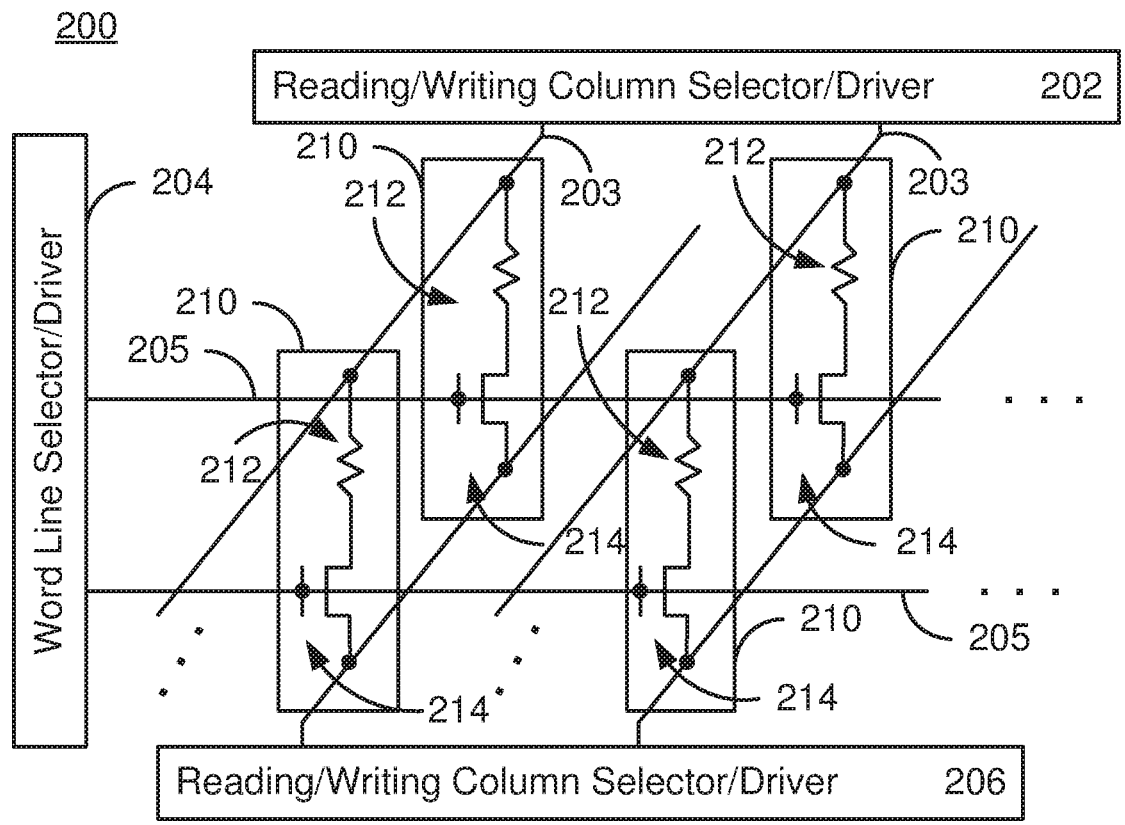
FIG. 5 depicts an exemplary embodiment of a memory utilizing magnetic junctions in the memory element(s) of the storage cell(s).

FIG. 5 depicts an exemplary embodiment of a memory 200 that may use one or more of the magnetic junctions 100, 100', 100A, 100B, 100C and/or other magnetic junctions. The magnetic memory 200 includes reading/writing column select drivers 202 and 206 as well as word line select driver 204. Note that other and/or different components may be provided. The storage region of the memory 200 includes magnetic storage cells 210. Each magnetic storage cell includes at least one magnetic junction 212 and at least one selection device 214. In some embodiments, the selection device 214 is a transistor. The magnetic junctions 212 may be one of the 100, 100', 100A, 100B, 100C and/or other analogous magnetic junction(s). Although one magnetic junction 212 is shown per cell 210, in other embodiments, another number of magnetic junctions 212 may be provided per cell. Because the magnetic memory 200 includes one or more of the magnetic junctions 100, 100', 100A, 100B, 100C and/or an analogous magnetic junction, the magnetic memory 200 may enjoy the benefits described above.

Various features have been described with respect to the magnetic junctions 100, 100', 100A, 100B and 100C and the magnetic memory 200. One of ordinary skill in the art will recognize that these features may be combined in manner(s) not shown and which are not inconsistent with the devices and methods described herein. Thus, the magnetic junction in accordance with the methods, systems and devices described herein need not be explicitly depicted.

Figure 6:
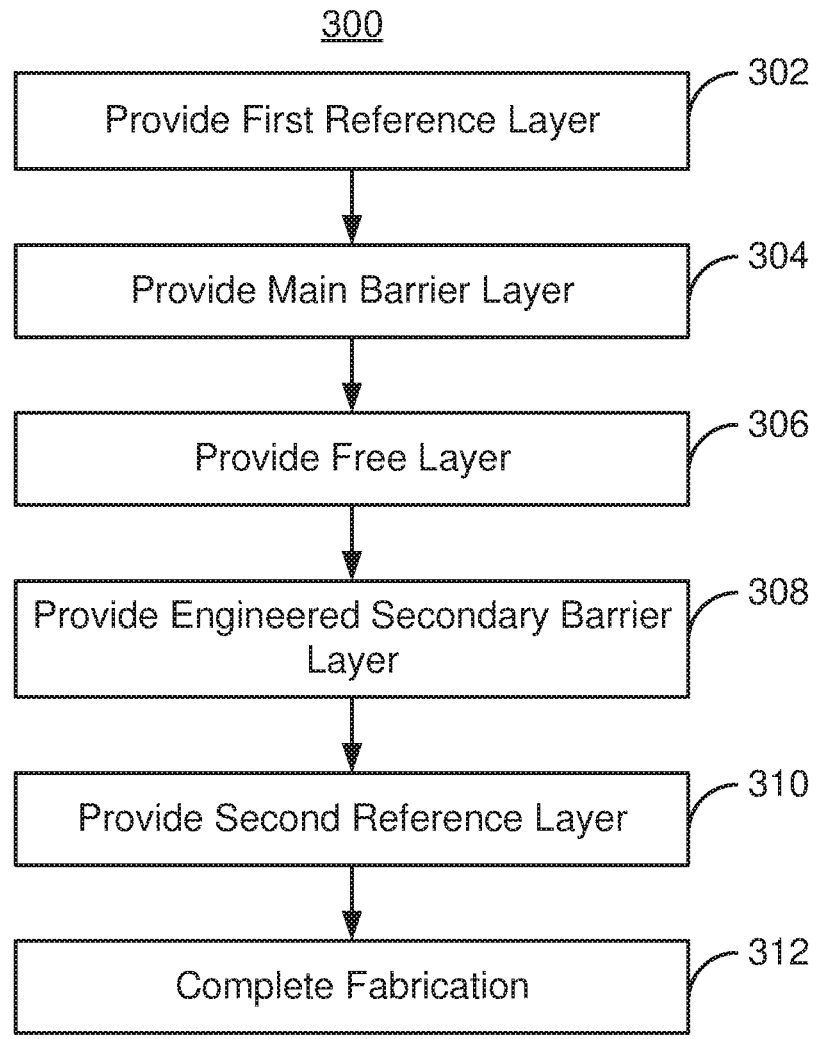
FIG. 6 is a flow chart depicting an exemplary embodiment of a method for providing a magnetic junction usable in a magnetic memory, programmable using spin transfer torque and including an engineered secondary barrier layer.

FIG. 6 depicts an exemplary embodiment of a method 300 for fabricating a magnetic junction usable in a magnetic device such as a spin transfer torque random access memory (STT-RAM) and, therefore, in a variety of electronic devices. For simplicity, some steps may be omitted, performed in another order and/or combined. Further, the method 300 may start after other steps in forming a magnetic memory have been performed. The method 300 is also described in the context of forming a single magnetic junction. However, multiple magnetic junctions may be formed substantially simultaneously. The method 300 is also described in the context of the magnetic junction 100. However, another magnetic junction such as the magnetic junction(s) 100', 100A, 100B, 100C and/or an analogous magnetic junction might be formed.

The reference layer 110 is provided, via step 302. The reference layer 110 is magnetic and may have its magnetization pinned, or fixed, in a particular direction during at least a portion of the operation of the magnetic junction. The reference layer formed in step 302 may be a single layer or a multilayer. The reference layer formed in step 302 may have a perpendicular anisotropy energy that exceeds the out-of-plane demagnetization energy. Thus, the reference layer may have its magnetic moment oriented perpendicular to plane. For example, step 302 may include providing a Co/Pt multilayer, a Co/Ir multilayer or both multilayers.

Step 302 may include depositing the reference layer on seed layer(s) 102. The seed layer(s) 102 may be selected for various purposes including but not limited to the desired crystal structure of the reference layer, magnetic anisotropy and/or other magnetic characteristics of the reference layer. For example, the reference layer may be provided on a seed layer such as a (100) crystalline MgO layer that promotes a perpendicular magnetic anisotropy in the reference layer.

A main barrier layer 120 is provided, via step 304. In some embodiments, a crystalline MgO tunneling barrier layer may be formed. A MgAlOx, MgTiOx, MgFeOx may be used in lieu or in addition to MgO in some embodiments. Step 304 may include depositing MgO, which forms a tunneling barrier layer. In some embodiments, step 304 may include depositing MgO using, for example, radio frequency (RF) sputtering. Metallic Mg may be deposited, then oxidized in step 306 to provide a natural oxide of Mg. The MgO barrier layer/nonmagnetic spacer layer may also be formed in another manner. Step 306 may include annealing the portion of the magnetic junction already formed to provide crystalline MgO tunneling barrier with a (100) orientation for TMR of the magnetic junction.

The free layer 130 is provided, via step 306. Step 306 includes depositing the material(s) for the free layer. The free layer 130 provided in step 306 may be desired to have a perpendicular magnetic anisotropy that exceeds its demagnetization energy. The magnetic moment of the free layer may thus be stable out-of-plane, including perpendicular-to-plane. The free layer 130 provided in step 306 is also configured to be switched between stable magnetic states when a write current is passed through the magnetic junction. Thus, the free layer 130 is switchable utilizing spin transfer torque. The free layer 130 provided in step 306 is also magnetic and thermally stable at operating temperatures.

The engineered secondary barrier layer 140 is provided, via step 308. Step 308 may be analogous to step 304. However, the thickness (t2) of the secondary barrier layer 140 is less than the thickness (t1) of the main barrier layer 120. In addition, step 308 includes formation of lower resistance regions 142. Thus, regions 142 may have a reduced thickness. In some embodiments a zero thickness may be possible if pinholes are formed. In other embodiments the thickness is nonzero throughout the secondary barrier layer 140. Step 308 may include formation of regions of higher metallic concentration. Thus, regions 140 of higher conductivity/lower resistivity may be formed in step 308.

The reference layer 150 is provided, via step 310. Step 310 may be analogous to step 302. Fabrication of the device may be completed, via step 320. For example, the capping layer(s) 104 may be deposited and the edges of the magnetic junction defined, for example by providing a mask on the layers that have been deposited and ion milling the exposed portions of the layers. Note that although the layers are described as being provided, in some embodiments, steps 302, 304, 306, 308 and 310 include providing the layers in a magnetic junction stack. The edges of the junction may be defined after all layers in the magnetic junction have been deposited. Additional structures, such as contacts and conductive lines may also be formed for the device in which the magnetic junction is used. Fabrication of the magnetic junction may then be completed.

Although described in a particular order, the steps of the method 300 may be performed in another order. For example, steps 304 and 310 may be swapped. In other embodiments, the steps may be performed in the following order 310, 308, 306, 304, 302 and 312. Thus, the magnetic junctions 100, 100', 100A, 100B, 100C and/or an analogous magnetic junction may be formed.

Using the method 300, a magnetic junction having improved performance despite the use of high temperature anneals may be provided. Thus, the method 300 may allow fabrication of a dual magnetic junction having an engineered secondary barrier layer 140, 140', 140A, 140B, 140C and/or an analogous layer.

Figure 7:
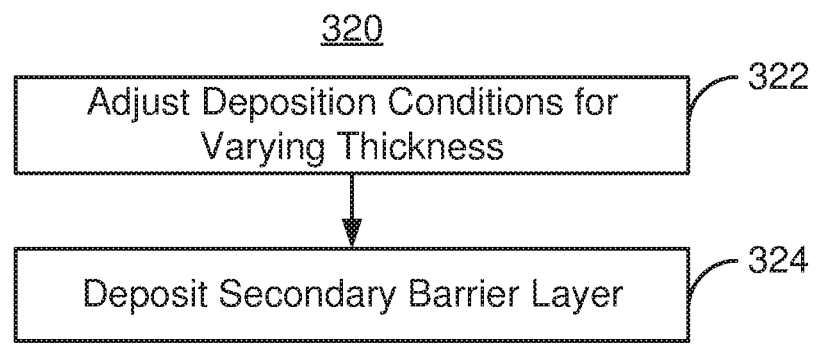
FIG. 7 is a flow chart depicting an exemplary embodiment of a method for providing one embodiment of an engineered secondary barrier layer.

FIG. 7 is a flow chart depicting an exemplary embodiment of a method 320 for providing a portion of a magnetic junction usable in a magnetic device. More specifically, the method 320 is used in forming the secondary barrier layer. For simplicity, some steps may be omitted, performed in another order, include substeps and/or combined. Although described in terms of a single magnetic junction, multiple magnetic junctions may be fabricated. For simplicity, the method is described in the context of the magnetic junction 100A. However, the method 330 may be used for any of the magnetic junctions 100, 100', 100A, 100B, 100C and/or an analogous magnetic junction.

The deposition conditions for an engineered secondary barrier layer 140A having varying thickness are set, via step 322. For example, the deposition temperature, pressure and other conditions may be adjusted such that pinholes 142A are formed. The secondary barrier layer 140A is then deposited, via step 324 using the deposition conditions. Steps 322 and 324 may be repeated to adjust the deposition conditions as desired. In addition, step 324 is carried out so that a thin layer 140A is provided. In some embodiments, thinned regions of the layer 140A only are formed in step 324. In other embodiments, thinned regions and pinholes are formed. In other embodiments, pinholes only may be formed. In some embodiments, voids may be formed. Thus, the secondary barrier layer 140A or 140B may be provided.

Using the method 320, an engineered secondary barrier layer that may improve the write and/or read characteristics of the magnetic junction may be formed. Thus, the method 320 may allow fabrication of a magnetic junctions having improved performance.

Figure 8:
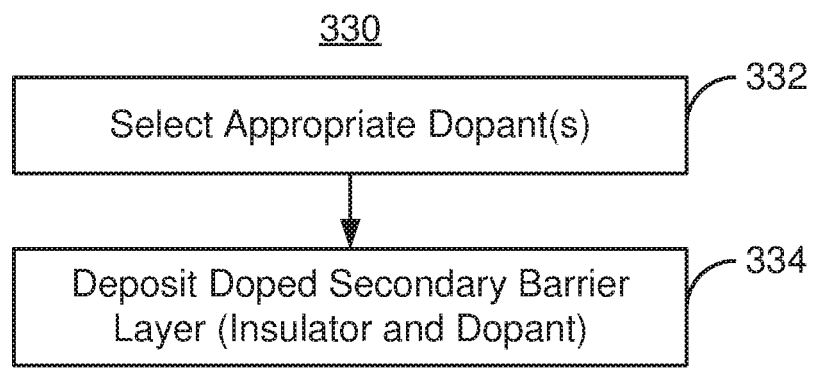
FIG. 8 is a flow chart depicting another exemplary embodiment of a method for providing one embodiment of an engineered secondary barrier layer.

FIG. 8 is a flow chart depicting an exemplary embodiment of a method 330 for providing a portion of a magnetic junction usable in a magnetic device. The method 320 is used in forming the secondary barrier layer. For simplicity, some steps may be omitted, performed in another order, include substeps and/or combined. Although described in terms of a single magnetic junction, multiple magnetic junctions may be fabricated. For simplicity, the method is described in the context of the magnetic junction 100C. However, the method 330 may be used for any of the magnetic junctions 100, 100', 100A, 100B, 100C and/or an analogous magnetic junction.

The appropriate dopants for the higher conductivity regions 142C are selected, via step 332. The selection of dopants in step 332 may depend at least in part on the material(s) used for the remainder of the barrier layer. For example, the dopant is desired to be more highly conductive/lower resistivity than the surrounding insulator. In some embodiments, the insulator includes one or more of MgO, MgAlOx, MgTiOx and MgFeOx. The dopants chosen in step 332 may include metal(s) such as Fe, Ni, Cr and Ti.

The doped secondary barrier layer 140C is deposited, via step 334. Step 334 may include co-depositing the insulator and the dopant such that the desired thickness of the secondary barrier layer 140C is obtained and that regions 142C high in dopant concentration are formed.

Using the method 330, an engineered secondary barrier layer 140C having lower resistivity regions 142C may be formed. Such an engineered secondary barrier layer may improve the write and/or read characteristics of the magnetic junction may be formed. Thus, the method 330 may allow fabrication of a magnetic junctions having improved performance.

Figure 9:
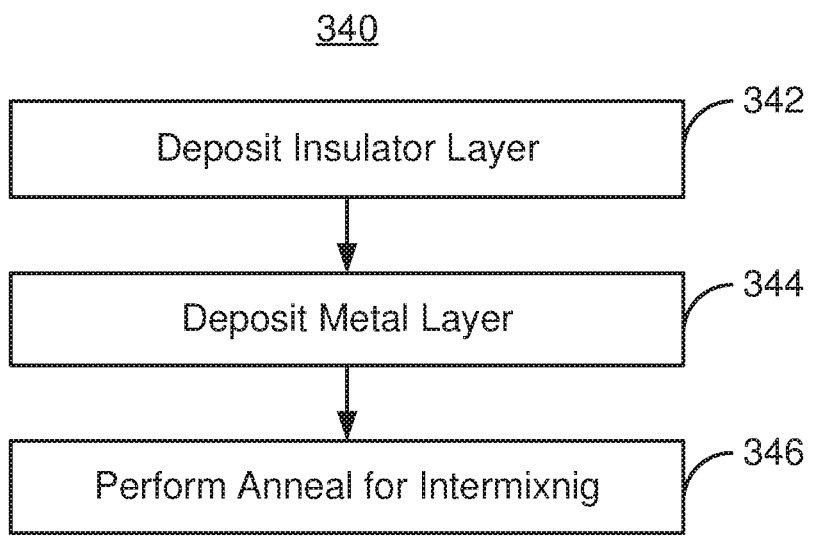
FIG. 9 is a flow chart depicting another exemplary embodiment of a method for providing one embodiment of an engineered secondary barrier layer.

FIG. 9 is a flow chart depicting an exemplary embodiment of a method 340 for providing a portion of a magnetic junction usable in a magnetic device. The method 340 is used in forming the secondary barrier layer. For simplicity, some steps may be omitted, performed in another order, include substeps and/or combined. Although described in terms of a single magnetic junction, multiple magnetic junctions may be fabricated. For simplicity, the method is described in the context of the magnetic junction 100C. However, the method 340 may be used for any of the magnetic junctions 100, 100', 100A, 100B, 100C and/or an analogous magnetic junction.

An insulating layer is deposited, via step 342. The insulators/oxides used in step 342 are those desired to be part of the engineered secondary barrier layer 140C. For example, the insulator may include one or more of MgO, MgAlOx, MgTiOx and MgFeOx. In some embodiments, the insulating layer is at least two Angstroms thick and not more than five Angstroms thick. In other embodiments, other thicknesses are possible.

A higher conductivity/lower resistivity layer is deposited, via step 344. Step 344 may include depositing a metal layer. The layer deposited in step 344 has a lower resistance (and RA) than the layer deposited in step 342. For example, step 344 may include depositing a layer of one or more of Fe, Ni, Cr and Ti. The total thickness of the layers deposited in steps 342 and 344 may be substantially the same as the thickness of the engineered secondary barrier layer 140C. For example, the conductive/lower resistivity layer may be greater than zero Angstroms thick and not more than approximately two Angstroms thick. In other embodiments, other thicknesses are possible.

The layers are annealed, via step 346. Step 346 may include annealing the layers provided in steps 342 and 344 in an oxidizing ambient, vacuum, or other gas(es). The annealing temperature exceeds room temperature but may be less than 400° C. The annealing temperature, time and ambient are selected to allow intermixing of the metal layer and the insulator layer. Thus, regions 142C are formed in the engineered tunneling barrier layer.

Using the method 340, an engineered secondary barrier layer 140C having lower resistivity regions 142C may be formed. Such an engineered secondary barrier layer may improve the write and/or read characteristics of the magnetic junction may be formed. Thus, the method 330 may allow fabrication of a magnetic junctions having improved performance.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device, the magnetic junction comprising:
   a first reference layer;
   a main barrier layer;
   a free layer, the free layer being switchable between a plurality of stable magnetic states when a write current is passed through the magnetic junction, the main barrier layer residing between the first reference layer and the free layer;
   an engineered secondary barrier layer, wherein the engineered secondary barrier layer has a plurality of regions having a reduced resistance less than a resistance of the engineered secondary barrier layer; and
   a second reference layer, the engineered secondary barrier layer being between the free layer and the second reference layer, each of the free layer, the first reference layer and the second reference layer having a perpendicular magnetic anisotropy energy and an out-of-plane demagnetization energy less than the perpendicular magnetic anisotropy energy.

2. The magnetic junction of claim 1 wherein the first reference layer and the second reference layer are in a dual state.

3. The magnetic junction of claim 1 wherein each of the plurality of regions has a reduced thickness less than a thickness of the engineered secondary barrier layer.

4. The magnetic junction of claim 1 wherein the engineered secondary barrier layer includes not more than five atomic percent of at least one metallic dopant, the plurality of regions being dopant rich.

5. The magnetic junction of claim 4 wherein the dopant includes at least one of Fe, Ni, Cr, Ti and Mg.

6. The magnetic junction of claim 1 wherein the engineered secondary barrier layer includes an insulator intermixed with at least one conductor, the plurality of regions being rich in the at least one conductor.

7. The magnetic junction of claim 6 wherein the at least one conductor includes at least one of Fe, Ni, Cr, Ti and Mg.

8. The magnetic junction of claim 1 wherein the engineered secondary barrier layer has a first resistance area product (RA), a first thickness and consists of at least one material, the first RA being less than a second RA of a nonengineered secondary barrier layer having the first thickness, consisting of the at least one material and being free of the plurality of regions.

9. The magnetic junction of claim 8 wherein the main barrier layer and the secondary barrier layer each include at least one of magnesium oxide, magnesium aluminum oxide, magnesium titanium oxide and magnesium iron oxide.

10. The magnetic junction of claim 1 wherein magnetic junction has a first tunneling magnetoresistance (TMR) and the engineered secondary barrier layer has a first thickness, the first TMR being greater than a second TMR of another magnetic junction including the first reference layer, the main barrier layer, the free layer, the second reference layer and a nonengineered secondary barrier layer having the first thickness, consisting of the at least one material and being free of the plurality of regions.

11. A magnetic memory residing on a substrate and comprising:
   a plurality of magnetic storage cells, each of the plurality of magnetic storage cells including at least one magnetic junction, each of the at least one magnetic junction including a first reference layer, a main barrier layer, a free layer, an engineered secondary barrier layer and a second reference layer, the free layer being switchable between a plurality of stable magnetic states when a write current is passed through the magnetic junction, the main barrier layer residing between the first reference layer and the free layer, the engineered secondary barrier layer having a resistance, wherein the engineered secondary barrier layer has a plurality of regions having a reduced resistance less than the resistance of the engineered secondary barrier layer, the secondary barrier layer being between the free layer and the second reference layer, each of the free layer, the first reference layer and the second reference layer having a perpendicular magnetic anisotropy energy and an out-of-plane demagnetization energy less than the perpendicular magnetic anisotropy energy; and
   a plurality of bit lines coupled with the plurality of magnetic storage cells.

12. A method for providing a magnetic junction usable in a magnetic device, the method comprising:
   providing a first reference layer;
   providing a main barrier layer;
   providing a free layer, the free layer being switchable between a plurality of stable magnetic states when a write current is passed through the magnetic junction, the main barrier layer residing between the first reference layer and the free layer;
   providing an engineered secondary barrier layer having a resistance, wherein the engineered secondary barrier layer has a plurality of regions having a reduced resistance less than the resistance of the engineered secondary barrier layer;
   providing a second reference layer, the secondary barrier layer being between the free layer and the second reference layer, each of the free layer, the first reference layer and the second reference layer having a perpendicular magnetic anisotropy energy and an out-of-plane demagnetization energy less than the perpendicular magnetic anisotropy energy.

13. The method of claim 12 wherein the first reference layer and the second reference layer are in a dual state.

14. The method of claim 12 wherein each of the plurality of regions has a reduced thickness less than a thickness of the engineered secondary barrier layer.

15. The method of claim 14 wherein the step of providing the engineered secondary barrier layer further includes:
provinding the engineered secondary barrier layer such that the plurality of regions has a zero thickness.

16. The method of claim 14 wherein the step of providing the engineered secondary barrier layer further includes:
doping the engineered secondary barrier layer with not more than five atomic percent of at least one metallic dopant, the plurality of regions being dopant rich.

17. The method of claim 12 wherein the engineered secondary barrier layer includes an insulator intermixed with at least one conductor, the plurality of regions being rich in the at least one conductor.

18. The method of claim 17 wherein the step of providing the engineered secondary barrier layer includes:
depositing a layer consisting of the insulator;
depositing at least one layer consisting of the at least one conductor; and
annealing the layer and the at least one layer to intermix the insulator with the at least one conductor.

\* \* \* \* \*